United States Patent
Kuo et al.

(10) Patent No.: US 12,495,558 B2
(45) Date of Patent: *Dec. 9, 2025

(54) INTEGRATED CIRCUIT INCLUDING TRENCH CAPACITOR

(71) Applicant: TAIWAN SEMICONDUCTOR MANUFACTURING COMPANY, LTD., Hsinchu (TW)

(72) Inventors: Wen-Feng Kuo, Hsinchu (TW); Chung-Chuan Tseng, Hsinchu (TW); Chia-Ping Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/306,490

(22) Filed: Apr. 25, 2023

(65) Prior Publication Data

US 2023/0261039 A1 Aug. 17, 2023

Related U.S. Application Data

(60) Continuation of application No. 17/740,271, filed on May 9, 2022, now Pat. No. 11,996,439, which is a division of application No. 16/518,257, filed on Jul. 22, 2019, now Pat. No. 11,329,125.

(60) Provisional application No. 62/734,644, filed on Sep. 21, 2018.

(51) Int. Cl.
*H10D 1/68* (2025.01)
*H10D 1/00* (2025.01)

(52) U.S. Cl.
CPC ............ *H10D 1/042* (2025.01); *H10D 1/716* (2025.01)

(58) Field of Classification Search
None
See application file for complete search history.

(56) References Cited

U.S. PATENT DOCUMENTS

| | | | |
|---|---|---|---|
| 6,261,895 B1 | 7/2001 | Adkisson et al. | |
| 11,329,125 B2* | 5/2022 | Kuo | ........................ H01L 28/91 |
| 2003/0213989 A1 | 11/2003 | Delpech et al. | |
| 2007/0001203 A1 | 1/2007 | Lehr et al. | |
| 2007/0275536 A1* | 11/2007 | Cremer | .................. H10D 1/716 |
| | | | 257/E27.092 |
| 2009/0108403 A1* | 4/2009 | Gogoi | .................... H10D 1/042 |
| | | | 257/532 |

(Continued)

FOREIGN PATENT DOCUMENTS

| | | |
|---|---|---|
| CN | 103346141 | 10/2013 |
| CN | 103346148 | 10/2013 |

*Primary Examiner* — Benjamin P Sandvik
(74) *Attorney, Agent, or Firm* — Hauptman Ham, LLP

(57) ABSTRACT

Capacitors for use in semiconductor devices including a plurality of first trenches in a first region of a substrate, the first trenches extending in a first direction, a plurality of second trenches in the first region of the substrate, the second trenches extending in a second direction other than the first direction, with the adjacent second trenches and first trenches cooperating to define protruding structures and island structures having an upper surface that is at or below a plane defined by a portion of an upper surface of a substrate surrounding the first region with a series of film pairs including a dielectric layer and a conductive layer formed in the first and second trenches and the protruding and island structures.

20 Claims, 10 Drawing Sheets

(56) References Cited

U.S. PATENT DOCUMENTS

| | | |
|---|---|---|
| 2009/0244808 A1 | 10/2009 | Ohtsuka et al. |
| 2010/0118465 A1 | 5/2010 | Onishi et al. |
| 2015/0076657 A1* | 3/2015 | Chou .................. H10D 84/212 257/532 |
| 2016/0020267 A1 | 1/2016 | Lin |
| 2017/0271436 A1 | 9/2017 | Tsui et al. |
| 2020/0176552 A1 | 6/2020 | Chang et al. |

* cited by examiner

INTEGRATED CIRCUIT INCLUDING TRENCH CAPACITOR

PRIORITY STATEMENT

This application claims priority from U.S. Prov. Pat. Appl. No. 62/734,644, filed Sep. 21, 2018, and U.S. patent application Ser. No. 16/518,257, filed Jul. 22, 2019, which was issued as U.S. Pat. No. 11,329,125, on May 10, 2022, and is a divisional application of and claims priority from U.S. patent application Ser. No. 17/740,271, filed May 9, 2022, now U.S. Pat. No. 11,996,439, issued May 28, 2024, with the contents of each priority document being incorporated by reference in its entirety.

BACKGROUND

Integrated circuits frequently include capacitors in order to perform data storage in memory chips or to regulate timing of elements in an integrated circuit. Capacitors have high aspect ratios, such as via-like capacitors that are etched deep into a dielectric medium, or are elongated, such as trench capacitors. A capacitor's storage increases when the surface area of the capacitor plates increases, the distance between the capacitor plates decreases, and/or the permittivity of the dielectric material between capacitor plates increases. The cost of manufacturing an integrated circuit is reduced by reducing overall integrated circuit layout area, in order to fit more circuit dies on a manufacturing substrate. Overall circuit layout area is reduced by reducing layout area of individual circuit components, including capacitors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
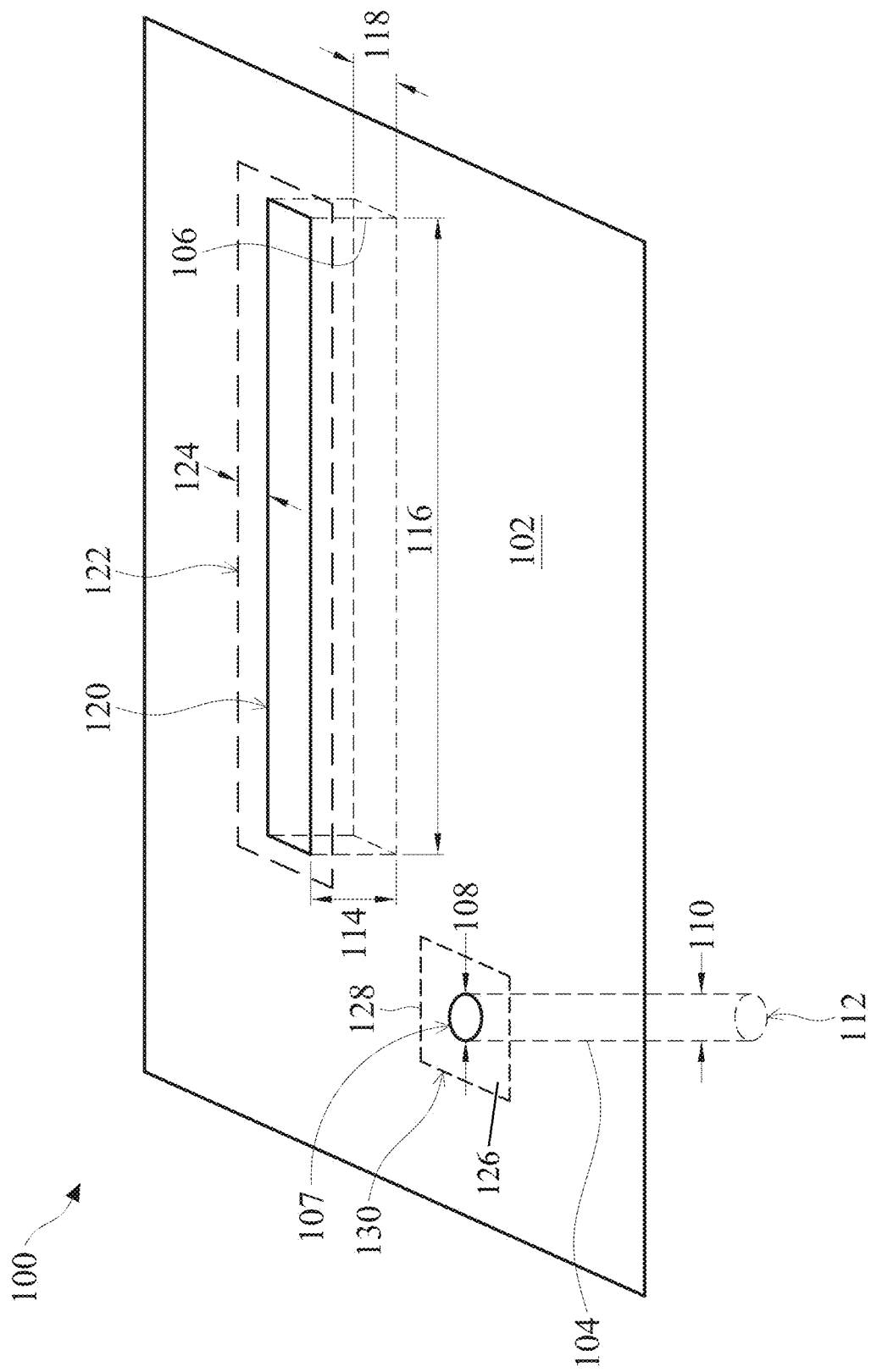
FIG. 1 is an integrated circuit having capacitors in accordance with some embodiments.

The following disclosure provides many different embodiments, or examples, for implementing different features of the provided subject matter. Specific examples of components, values, operations, materials, arrangements, and the like, are described below to simplify the present disclosure. These are, of course, merely examples and are not intended to be limiting. Other components, values, operations, materials, arrangements, and the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The term "on" indicates that two layers or portions of an object are either in direct contact, or that one is "above" another (as viewed in drawings of the object) with intervening layers or objects. The term "directly on" is used to refer to two objects or layers that at least partially in direct contact with no intervening objects or layers at the point of direct contact. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electrical circuits contain assemblies of basic components such as transistors, resistors, capacitors, and inductors. The function of an electrical circuit depends on the content and arrangement of the various basic components. Integrated electrical circuits include components with particular structural designs that allow the manufacture and integration of circuit components on a single semiconductor substrate. Capacitors are found in many integrated circuits and are used for storing electrical charge. The charging and discharging of a capacitor is relevant to the timing of circuit performance, the storage and preservation of information in a memory circuit, or the protecting of an integrated circuit from electrical damage. Capacitors for storing data are found in dynamic random access memory (DRAM) integrated circuit applications, in some embodiments.

FIG. 1 is a schematic diagram of an integrated circuit 100 in a substrate 102, the circuit having a via capacitor 104 and a trench capacitor 106, according to some embodiments. In some embodiments, substrate 102 is a dielectric material such as silicon dioxide. In some embodiments, substrate 102 is a semiconductor material. In some embodiments, the substrate 102 is a doped semiconductor material. Via capacitor 104 extends vertically into substrate 102 of an integrated circuit. Trench capacitor 106 extend horizontally along a surface of substrate 102. Capacitance of via-shaped capacitors is adjusted by modifying the size of the via. Via capacitor 104 has an opening 107 with an opening diameter 108, a shaft diameter 110, and a via depth 112. Via size is adjusted by changing the depth and/or diameter of the via. Via diameter corresponds to the opening diameter 108 and/or the shaft diameter 110 of the via. Trench capacitor 106 has a trench depth 114, a trench length 116, and a trench width 118. Trench capacitor 106 has a trench capacitor layout area 120 surrounded by a layout perimeter 122, at least a first distance 124 from the trench opening. Via capacitor 104 has a via capacitor layout area 126 surrounded by a layout perimeter 128 at least a second distance 130 from via opening 107. Capacitance of via capacitor 104 is determined by dimensions of the capacitor. Capacitance of via capacitor 104 is increased by increasing opening diameter 108, shaft diameter 110, and/or depth 112. Capacitance of trench capacitor 106 is increased by increasing trench depth 114, trench width 118, and/or trench length 116.

Individual capacitors such as trench capacitor 106 and via capacitor 104 have layout areas surrounding them, such as layout area 120 (for trench capacitor 106) and layout area 126 (for via capacitor 104). Generally, design rules of an integrated circuit regulate the sizes of and spacing between circuit elements, and layout areas included in IC design rules provide minimum spacing between capacitors and adjoining features (other capacitors, as well as wiring and interconnect structures) in order to reduce or control parasitic capacitance, cross talk, and other circuit performance features. Increasing (or, in some embodiments, decreasing) a capacitor dimension sometimes alters the capacitor layout area. In some embodiments, via capacitor 104 is lengthened (e.g., have a greater depth) without modifying the layout area 126 on a top surface of substrate 102. When an opening diameter 108 of via opening 107 is enlarged, layout area 126 increases according to design rules for the integrated circuit 100. Trench capacitor 106 has layout area 120 that increases when trench length 116 and/or trench width 118 increase. Layout area 120 does not increase or decrease when trench depth 114 is modified because the dimensional change of trench capacitor 106 is perpendicular to the top surface of substrate 102 where layout area 120 is located.

One method of increasing capacitance of an integrated circuit capacitor, without merely modifying a dimension of the capacitor, is to change the shape or layout of the capacitor. While modifying trench length 116 and/or trench width 118 of trench capacitor 106 modifies the capacitance, trench capacitor 106 remains a linear trench capacitor after one or more dimensions are modified. Some embodiments of the present disclosure include trench capacitors that have a cross-hatched shape instead of being linear trench capacitors common to many manufacturing processes. Cross-hatched shapes of trench capacitors include, in some embodiments, one or more primary trenches extending in a first direction, intersected by one or more secondary trenches extending in a second direction different from the first direction, such that the substrate supporting the cross-hatched trench capacitor has been divided, in a plan view, to form islands or intruding areas. Within the layout area of a trench capacitor, inclusion of secondary trenches has the effect of substantially increasing the surface area within the trench(es) for receiving conductive layers that serve as capacitor plates. Trench capacitors having a cross-hatched structure use the area within the layout area more efficiently than trench capacitors without secondary trenches extending from, or cross-connecting, primary trenches. In some embodiments, cross-hatched trench capacitors have over twice the capacitance of linear trench capacitors for the same layout area of an integrated circuit.

Figure 2:
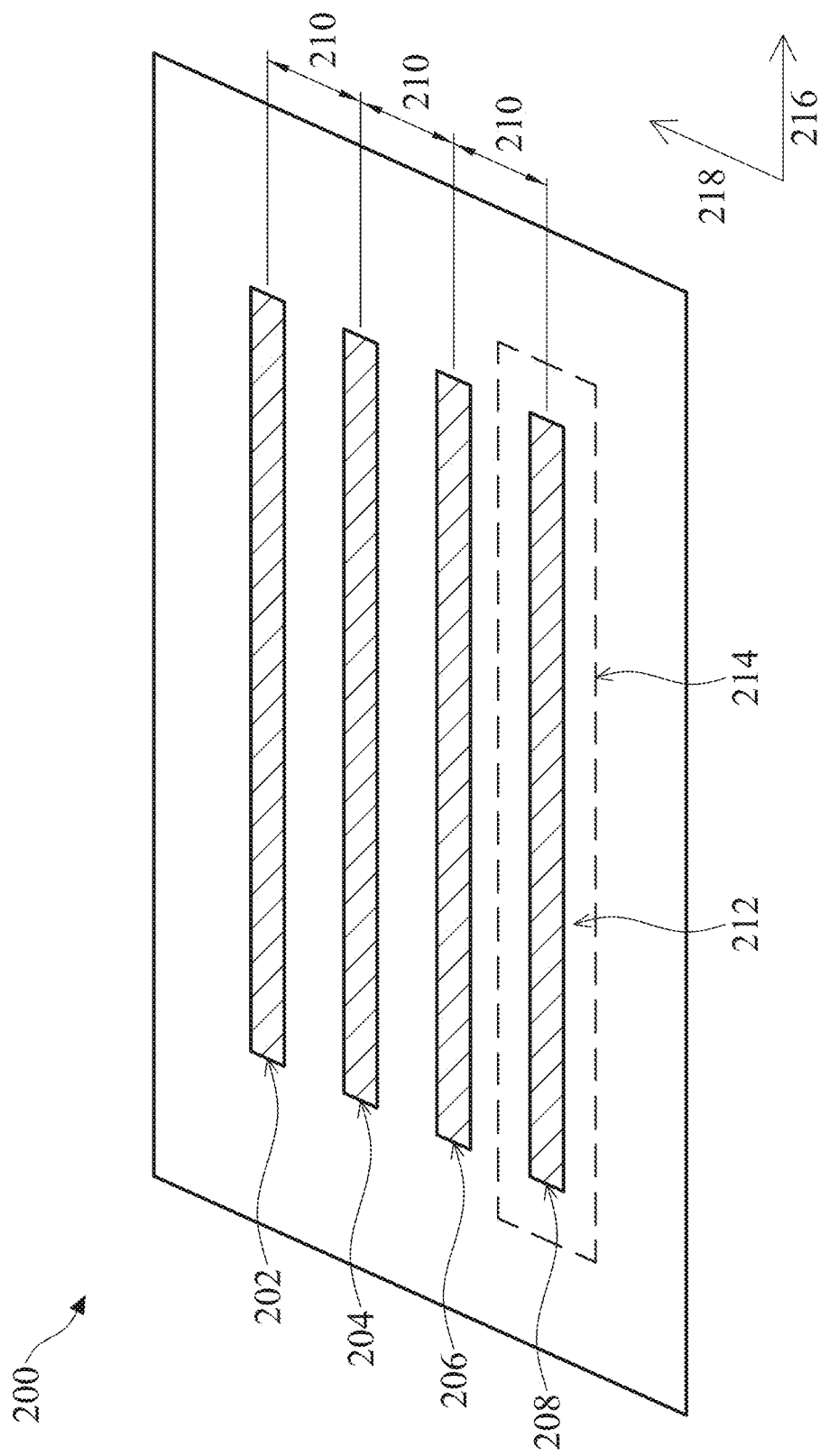
FIG. 2 is a plan view of linear trench capacitors in an integrated circuit according to some embodiments.

FIG. 2 is a plan view of an array 200 of linear trench capacitors 202, 204, 206, and 208, arranged in parallel in a substrate material and separated by a design rule separation distance 210, such that each trench capacitor of the array 200 has a layout area 212 surrounding the trench within a layout perimeter 214. A majority of the surface area of a substrate having the array 200 of linear trench capacitors comprises empty space surrounding the trenches. Trench capacitors such as trench capacitors 202, 204, 206, and 208 are straight, and, for a given trench size, maximize the fraction of the layout area that borders trenches from adjoining trenches or other circuit elements.

Figure 3:
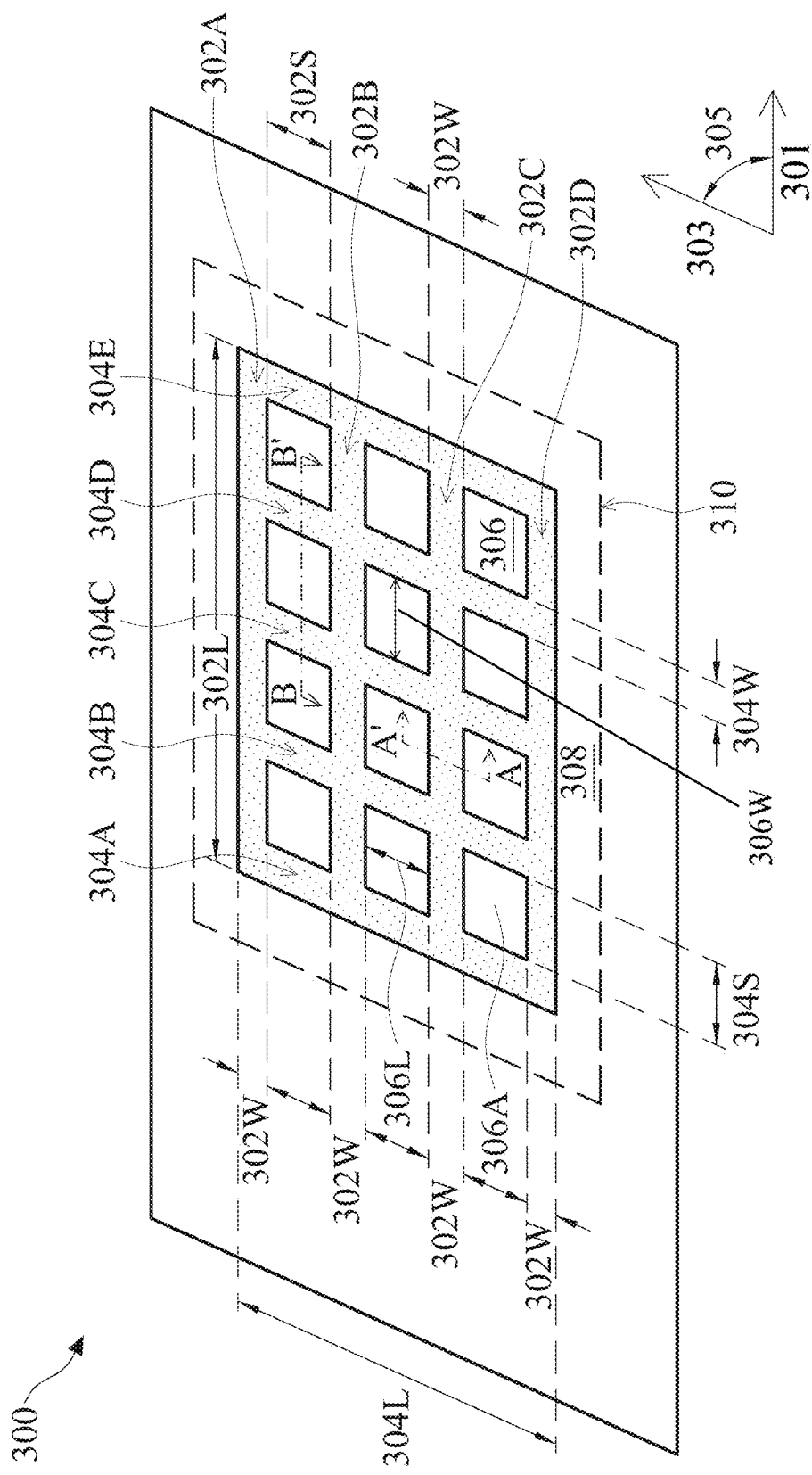
FIG. 3 is a plan view of a trench capacitor having an open cross-hatched structure, according to some embodiments.

FIG. 3 is a plan view of a single cross-hatched trench capacitor 300 that includes a set of primary trenches 302A-D extending in a first direction 301 and a set of secondary trenches 304A-E, extending in a second direction 303. First direction 301 and second direction 303 are perpendicular in some embodiments. In some embodiments, an angle 305 between the first direction and the second direction ranges from about 30 degrees to about 150 degrees, although angles outside this range are also within the scope of this disclosure. Each primary trench of cross-hatched trench capacitor 300 has a primary trench width 302W and a primary trench length 302L. Each secondary trench of cross-hatched trench capacitor 300 has a secondary trench width 304W and a secondary trench length 304L. Embodiments of cross-hatched trench capacitors are not restricted by the particular dimensions or embodiment represented by cross-hatched trench capacitor 300, however; in some embodiments primary and/or secondary trenches each have different widths and/or different lengths according to designs of an integrated circuit without adverse effect on a capacitor function. Further, embodiments of cross hatched trench capacitors have different numbers of primary trenches and secondary trenches than are depicted in FIG. 3. In some embodiments, a number of primary trenches and/or secondary trenches, and the dimensions of the trenches (width, length, depth, intersection spacing, or the like) are adjusted and modified according to an integrated circuit design rule in order to meet a desired performance metric while remaining within the scope of the present disclosure.

Cross-hatched trench capacitor 300 further includes islands (also referred to as pillars) 306 located between intersections of adjoining primary trenches and secondary trenches. Island 306A, for example, is situated between primary trenches 302A and 302B, and between secondary trenches 304A and 304B. Island 306A has an island length 306L and an island width 306W, where 306W is the distance between adjacent secondary trenches 304A-B, and 306L is the distance between adjacent primary trenches 302A-B. In cross-hatched trench capacitor 300, each island 306 has a same island area because each primary trench 302 has a same primary trench spacing distance 302S, and each secondary trench has a same secondary trench spacing distance 304S. In some embodiments, primary trench spacing and secondary trench spacing are different for each pair of primary and secondary trenches in a cross-hatched trench capacitor without limiting the scope of the present disclosure.

Cross-hatched trench capacitor 300 has a layout area 308 within a layout area perimeter 310. An outer edge of cross-hatched trench capacitor 300 is separated from layout area perimeter 310 by a design rule separation distance 312. In some embodiments, design rule separation distance is the same on all sides of a cross-hatched trench capacitor. In some embodiments, the design rule separation distance is different on some or all sides of the layout area. In some embodiments, a layout area of a cross-hatched trench capacitor is smaller than the layout area of a linear trench capacitor when the two capacitors have equal capacitance. Integrated circuits having cross-hatched trench capacitors use less layout area or perform to a higher standard (e.g., longer charge decay times) than integrated circuits having linear trench capacitors. Linear trench capacitors have elongated layout areas, while cross-hatched trench capacitors have shapes with much different "aspect ratios" (i.e., ratios of the long dimension to the short dimension) and shapes. In some embodiments, a cross-hatched trench capacitor has a square layout area with an aspect ratio of 1:1 (length:width). Capacitance of a single capacitor per unit of layout area increases for cross-hatched trench capacitors, as compared to linear trench capacitors, because the less-elongated layout area of a cross-hatched trench capacitor "packs" conductive surface area (e.g., the sidewalls of the primary and secondary trenches) into the layout area more efficiently than linear trenches do in linear trench layout areas. A conductive layer used in a capacitor plate extends across sidewalls and a bottom of a trench for a trench capacitor. Cross-hatched structure of trenches increases the surface area on which conductive layers are deposited (e.g., by using the previously unused space between long stretches of primary trenches to hold short segments of secondary trenches) within a capacitor structure to increase capacitance or provide greater capacitance per unit of layout area of an integrated circuit.

Figure 4A:
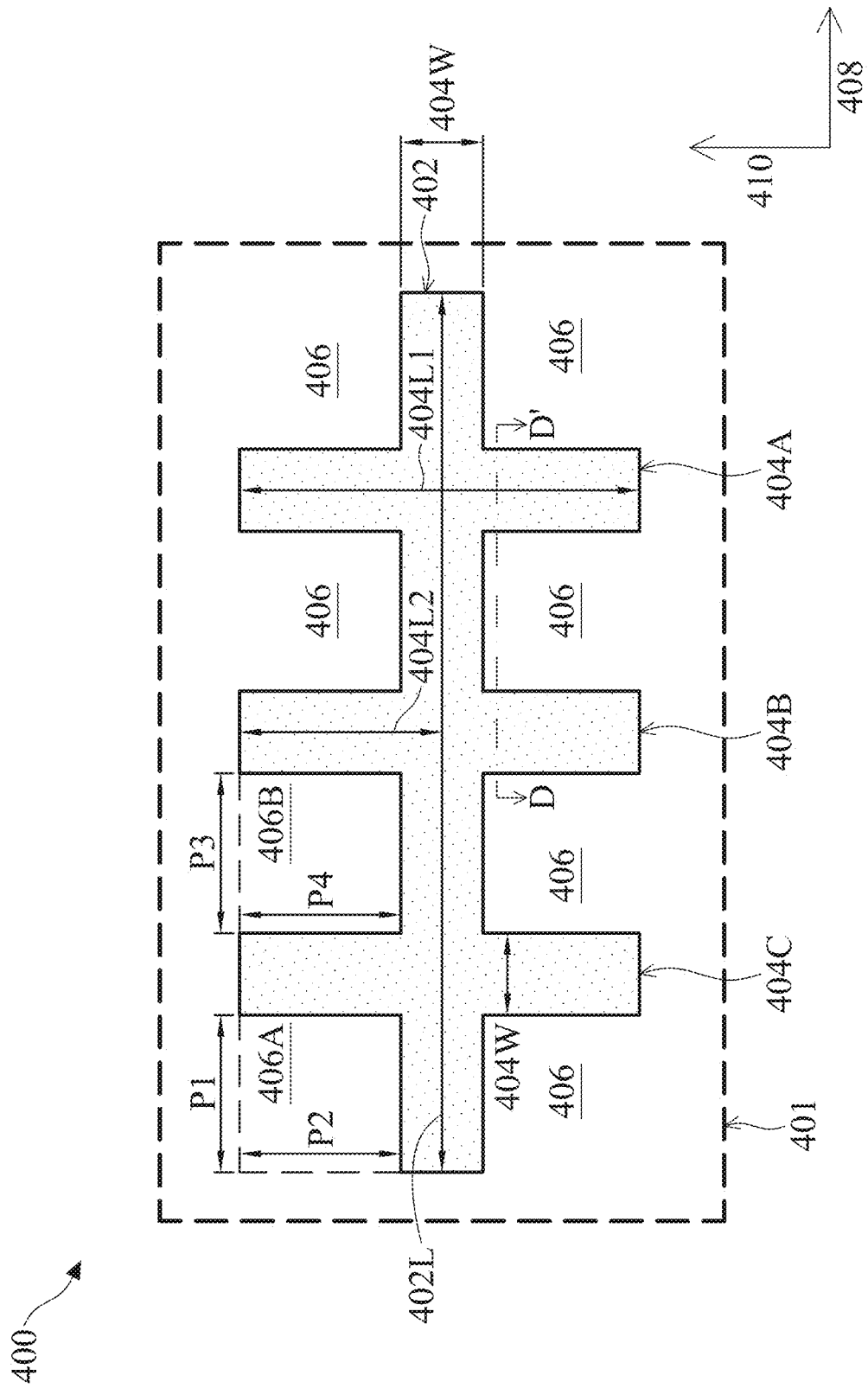
FIGS. 4A and 4B are plan views of trench capacitors having at least some closed cross-hatched structure, according to some embodiments.

FIG. 4A depicts an embodiment of an "open layout" cross-hatched trench capacitor 400 (also known as a pure open layout cross-hatched trench capacitor), according to one or more embodiments. Cross-hatched trench capacitor 300 is representative of a "closed layout" capacitor, where primary and secondary trenches of the capacitor form sidewalls of the capacitor in the substrate where the capacitor is formed. In closed layout capacitors, trench intersections at corners of the capacitor are generally "L" shaped, intersections along capacitor sidewalls are "T" shaped, and interior intersections are "X" shaped. In some embodiments, closed layout capacitors have only islands or pillars of substrate material within a layout area of the capacitor. Cross-hatched trench capacitor 400 is representative of an "open layout" capacitor, where some trenches, or portions thereof, extend outward past an intersection with another trench to form intruding areas of substrate material around a perimeter of the capacitor into the capacitor area.

Cross-hatched trench capacitor 400 has a single primary trench 402 extending along a first direction 408, and three secondary trenches 404A-C extending along a second direction 410. For purposes of naming within the scope of the present disclosure, primary trenches are those trenches with the longest trench length, and those trenches that are parallel with them, and secondary trenches are shorter than the primary trenches (generally) and at an angle thereto. According to some embodiments, primary trenches and secondary trenches have a same length in the substrate. Primary trench 402 has a primary trench length 402L and a primary trench width 402W. Secondary trenches 404A-C have a secondary trench width 404W, and two associated lengths: a total secondary trench length 404L1 (measured from a terminal end to a distal end of a secondary trench), and an abbreviated secondary trench length 404L2, measuring a protrusion of the secondary trench beyond a sidewall of a primary trench. Intruding areas 406 around cross-hatched trench capacitor 400 all have a same area. Intruding areas around other open layout cross-hatched trench capacitors are all a same size, or each have different sizes, according to the dimensions and locations of the trenches in the trench capacitors of one or more embodiments. Intruding area 406A (bounded on two sides by the trenches of the trench capacitor) has a first intruding area length P1 and a first intruding area width P2 and intruding area 406B (bounded on three sides by the trench capacitor) has a second intruding area length P3 and a second intruding area width P4. The particular embodiments of cross-hatched trench capacitors included herein (e.g., closed layout cross-hatched trench capacitor 300 and open layout cross-hatched trench capacitor 400) are two among many cross-hatched trench capacitor structures that are included within the scope of the present disclosure, which may include combinations of "open" and "closed" layout portions on different sides of a cross-hatched trench capacitor and have at least one island or pillar at an interior of the capacitor, and/or at least one intruding area feature adjoining and outside the capacitor.

Figure 4B:
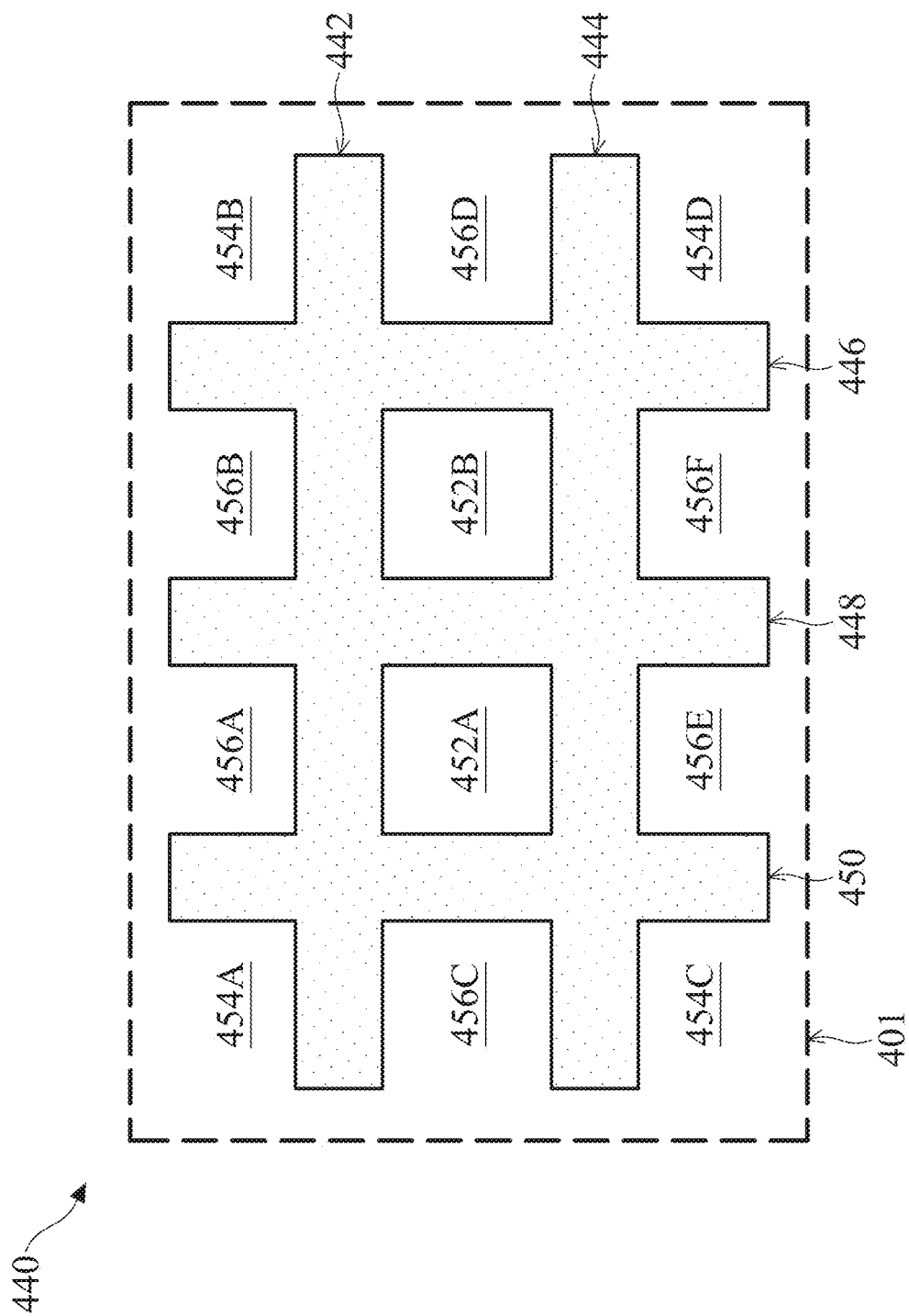

FIG. 4B is a plan view of a cross-hatched trench capacitor 440 having aspects of open and closed layouts as described above. Cross-hatched trench capacitor 440 has two primary trenches 442 and 444, intersected by three secondary trenches 446, 448, and 450. The intersections of primary and secondary trenches creates two islands 452A and 452B within cross-hatched trench capacitor 440, surrounded by a plurality of intruding areas 454A-454F with dimensions regulated by the lengths to which primary and secondary trenches extend past each other away from the islands 442 and 444 at the center region of cross-hatched trench capacitor 440. In some embodiments, outer portions of cross-hatched trench capacitors are a mixture of islands and intruding areas.

Figure 5:
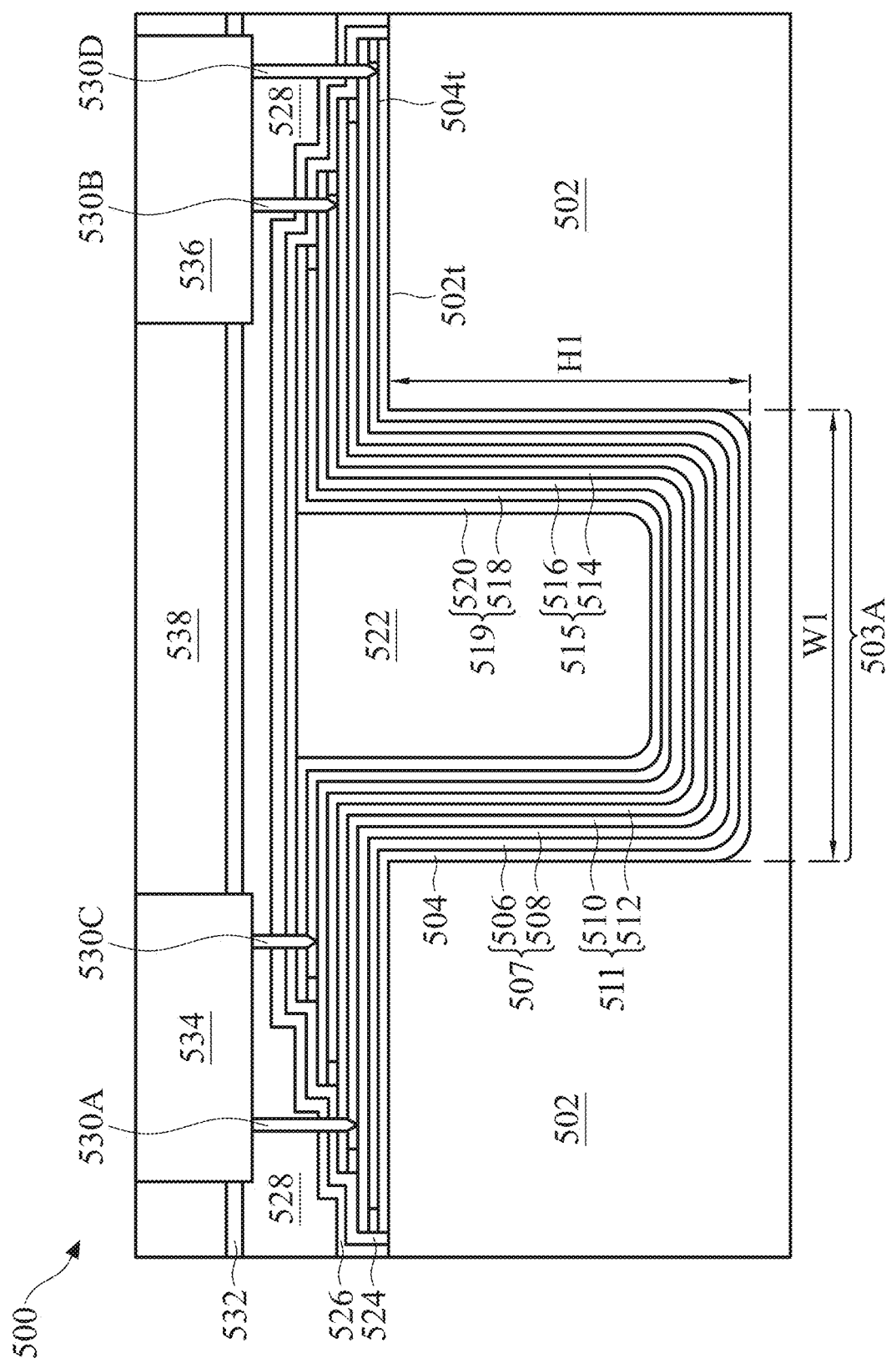
FIG. 5 is a cross-sectional view of a trench capacitor having a cross-hatched structure, according to some embodiments.
Figure 8:
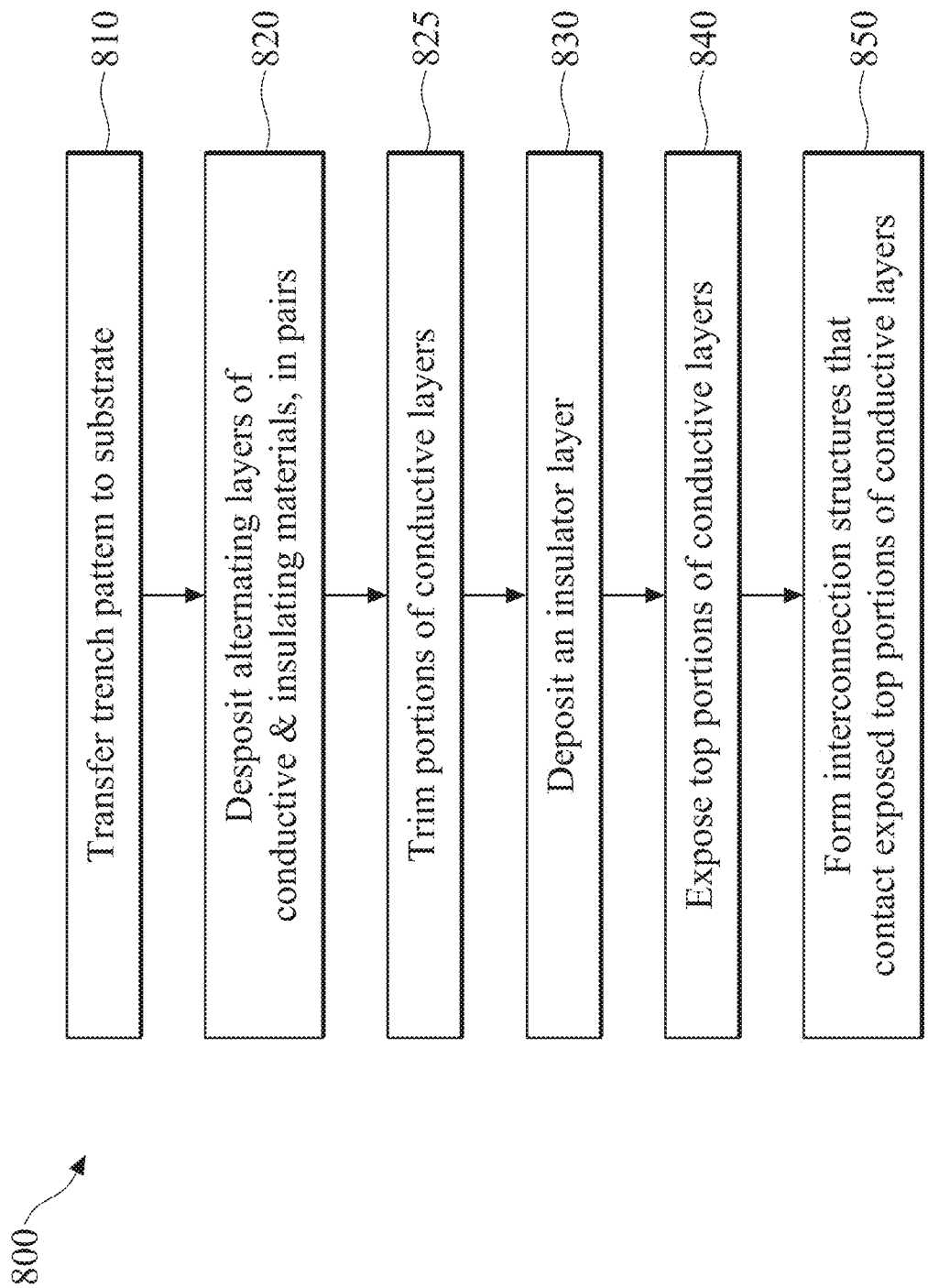
FIG. 8 is a flow diagram of a method of making a trench capacitor having a cross-hatched structure, according to some embodiments.

FIG. 5 is a cross-sectional diagram of a trench capacitor 500 embedded in a substrate 502. Trench capacitor 500 corresponds to the cross-sectional indicator A-A' of FIG. 3 and to the cross-sectional indicator D-D' of FIG. 4A. Aspects of a method 800 of manufacturing trench capacitor 500 are presented in the flow diagram of FIG. 8 and are described in parallel with the following description of the structure of trench capacitor 500. Trench capacitor 500 comprises a trench 503A having a trench width W1 and a trench depth H1. Manufacture of trench capacitor 500 includes a first operation 810, wherein a trench pattern (also called a capacitor pattern) of the trench capacitor 500 is transferred into a substrate 502. In some embodiments, substrate 502 includes one or more semiconductor materials. In some embodiments, substrate 502 includes elementary, or intrinsic, semiconductor materials, compound semiconductor materials, and/or alloy semiconductor materials. Examples of elementary semiconductor materials include, but are not limited to, monocrystalline silicon (Si), polycrystalline silicon (poly-Si), amorphous silicon (a-Si), germanium (Ge), and/or diamond (C). Binary compound semiconductor materials include, but are not limited to, IV-IV materials including silicon germanium (SiGe), germanium carbide (GeC), and silicon carbide (SiC), and III-V materials such as gallium arsenide (GaAs), gallium phosphide (GaP), indium phosphide (InP), indium arsenide (InAs), and/or indium antimonide (InSb). Semiconductor materials may also include, but not be limited to, tertiary and quaternary compound semiconductor materials such as GaAsP, AlInAs, AlGaAs, GaInAs, GaInP, and/or GaInAsP, although other compound semiconductor materials are also envisioned within the scope of the present disclosure. In some embodiments, substrate 502 includes one or more dielectric materials. In some embodiments, substrate material includes silicon dioxide, spin-on glass, borophosphosilicate glass (BPSG), fluorinated silica glass (FSG), low-K dielectric materials, silicon-oxy-nitride, of other dielectric material suitable for an inter-layer dielectric, or for forming a capacitor trench therein.

In some embodiments, the layer(s) incorporated in the substrate 502 are formed using a suitable technique or method including, but not limited to, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), atomic layer deposition (ALD), and/or combinations thereof.

In some embodiments, the substrate 502 includes both a semiconductor material and an insulating material to form a semiconductor-on-insulator (SOI) substrate. According to one or more embodiments, a SOI substrate includes at least one semiconductor layer formed on top of an insulating material (dielectric material) that electrically isolated the at least one semiconductor layer from adjoining semiconductor materials or other components of an integrated circuit, or adjoining integrated circuits, during a manufacturing process. SOI substrates sometimes include dielectric materials such as silicon dioxide or sapphire (e.g., silicon-on-sapphire (SOS)). Some embodiments of substrate 502 include strained semiconductor materials and/or epitaxially grown layers to promote carrier mobility in the semiconductor material.

In some embodiments, substrate 502 includes doped semiconductor materials. Some substrates may include single layers of semiconductor materials, according to one or more embodiments. Some substrates include multiple layers of semiconductor materials, according to one or more embodiments. According to one or more embodiments, dopants in a semiconductor material layer are found in multiple layers of a multiple-layer semiconductor material film stack or are found in a single layer of a multiple-layer semiconductor material film stack. According to some embodiments, one or more of the semiconductor materials are doped with at least one p-type and/or n-type dopant depending on the functional and/or performance target parameters for the semiconductor devices being manufactured on the substrate.

In some embodiments, operation 810 includes preparatory steps that are conducted before a trench pattern is etched into the substrate. Preparatory steps may include processing steps such as depositing a mask onto a top surface of a substrate in order to control dimensions of the trench pattern during the etch process. According to some embodiments, mask materials include, but are not limited to, photoresist, polyimide, silicon oxide, silicon nitride (e.g., $Si_3N_4$), SiON, SiC, SiOC, or combinations thereof. A mask may include a single layer of material, or multiple layers of material according to performance specifications of an integrated circuit and manufacturing processes thereof. In some embodiments, multiple layers of mask material are desirable when a process window for making a trench pattern in a substrate exhibits instability, when additional etch process selectivity is desired, or when a pattern benefits from improved shape control by the use of additional mask layers. Precursor steps may also include (when the mask material is not photoresist), depositing photoresist material onto a top surface of the substrate. In some embodiments, the photoresist material is a first mask layer. In some embodiments, the photoresist layer is a transitory layer used for transferring a pattern to a mask layer between the photoresist and the substrate. In some embodiments, the mask layer is an inorganic mask layer, comprising a silicon dioxide, silicon nitride, silicon oxy-nitride, or other mask layer capable of being selectively etched with respect to the substrate material.

In some embodiments, precursor steps include etching the mask layer on the substrate material before recessing the substrate material by etching a trench into the substrate material. Persons having ordinary skill in the art will recognize that the scope of suitable techniques that are compatible with forming a trench pattern in a substrate are included within the scope of the present disclosure and do not constrain the description of the present disclosure that is included herein.

In operation 810, transferring a trench pattern to the substrate occurs by etching the substrate using one or more mask layers on a top surface of the substrate. In some embodiments, the etching process is a wet chemical etch process. In some embodiments, the etch process is a dry etch or plasma etch process. The etch process to transfer the trench pattern to the substrate is selected according to the nature of the substrate being etched and to the desired characteristics of the trench pattern in the substrate. In some embodiments, plasma etching of a substrate material is performed using halogen-containing reactive gasses stimulated to dissociate into ions by strong electromagnetic fields. In some embodiments, reactive gasses include $CF_4$, $SF_6$, $NF_3$, $Cl_2$, $CCl_2F_2$, $SiCl_4$, $BCl_2$, or a combination thereof suitable for etching semiconductor substrate material. In some embodiments, reactive gasses include single gasses and combinations of gases suitable for etching dielectric materials into which trenches are being formed. Reactive ions are accelerated to strike a substrate material by alternating electromagnetic fields or by fixed bias according to techniques of plasma etching known in the art. Wet etching processes include exposure of a masked substrate to aqueous or dissolved etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof. According to some embodiments, a combination of both wet and dry etching processes is used to form a trench pattern in the substrate.

The trench pattern formed in the substrate includes sets of lines corresponding to primary and secondary trenches, according to one or more embodiments of the present disclosure. The number, spacing, dimensions, and orientation of trench lines in the trench pattern may vary according to individual integrated circuit design constraints. However, a trench pattern within the scope of the present disclosure is at least described as having one or more primary trenches (see, e.g., FIG. 3 elements 302A-D, or FIG. 4A element 402) extending in a first direction (see, e.g., FIG. 3 element 301, or FIG. 4A element 408) and at least one secondary trench extending in a second direction (see, e.g., FIG. 3 element 303, or FIG. 4A element 410) different from the first direction. Some embodiments of integrated circuit capacitors with cross-hatched trench patterns include a single primary trench and a single secondary trench. Some embodiments of integrated circuit capacitors with cross-hatched trench patterns include multiple parallel primary trenches and one or more secondary trenches. Some embodiments of integrated circuit capacitors with cross-hatched trench patterns include a single primary trench and multiple secondary trenches (see, e.g., cross-hatched trench capacitor 400). In some embodiments, a spacing between primary trenches is uniform throughout the trench pattern. In some embodiments, spacing between primary trenches is not uniform throughout the trench pattern. In some embodiments, a protruding portion of a trench portion may extend a different distance from an intersecting trench in a cross-hatched capacitor pattern than other trench portions that also extend from the intersecting trench and extend in the same direction. In some embodiments, cross-hatched trench patterns may include islands or pillars at an interior of the trench pattern. In some embodiments, cross-hatched trench patterns may include islands or pillars, and also include intruding areas around an exterior portion of a trench pattern for the capacitor. Subsequent to opening the mask layer(s) and etching the trench into the substrate (whether by wet etching or by dry/plasma etching), one or more mask layers are removed from the substrate top surface prior to proceeding with capacitor formation.

Method 800 includes operation 820, wherein alternating layers of insulating and conductive materials are deposited, in pairs. In some embodiments, an insulating layer is deposited first. In some embodiments, a conductive layer is deposited first. A pair of layers, one insulating and one conducting, is called a film pair.

In some embodiments, insulating layers are formed by chemical vapor deposition (CVD), atomic layer deposition (ALD), high density plasma CVD, sputtering, or any other suitable method, including those described previously, or combination of methods, for forming a generally conformal dielectric layer on the exposed surfaces of both the substrate and the trench sidewalls. In some embodiments, an insulating layer may include silicon dioxide ($SiO_2$), silicon nitride, SiON, SiC, SiOC, and/or combinations thereof. An insulating layer may also include one or more dielectric materials including, but not limited to, hafnium oxide ($HfO_x$), lanthanum monoxide (LaO), aluminum monoxide (AlO), aluminum oxide ($Al_2O_3$), zirconium monoxide (ZrO), titanium monoxide (TiO), tantalum pentoxide ($Ta_2O_5$), strontium titanate ($SrTiO_3$), barium titanate ($BaTiO_3$), hafnium silicate (HfSiO), lanthanum silicate (LaSiO), aluminum silicate (AlSiO), hafnium titanate ($HfTiO_4$) or combinations thereof.

In some embodiments, conductive layers are formed by CVD, ALD, HDPCVD, sputtering, or other suitable methods. Examples of a conductive layer may include polysilicon, metals, metal nitrides, silicides, metal alloys, or other suitable electrically conductive materials or combinations thereof. In some embodiments, conductive layers include multiple layers that perform functions additional to conducting/storing electrical charge. In some embodiments of the present disclosure, a same conductive layer is used throughout a set of film pairs. In some embodiments of the present disclosure, a same insulating layer is used throughout the set of film pairs. In some embodiments, each film pair uses the same conductive material and insulating material. In some embodiments, a set of film pairs uses different conductive materials at different layers in the stack of film pairs. In some embodiments, a set of film pairs uses different insulating materials at different layers in the stack of film pairs.

In some instances, conductive layers are formed from pure metal layers. In some embodiments, conductive layers include alloys of two or more metals. In some instances, conductive layers include a metal nitride, and/or metal silicide. Pure metals and alloys of two or more metals are formed from sputtering, atomic layer deposition, CVD, PECVD, or other deposition techniques known in the art. In some embodiments, metal silicide layers are formed by depositing a layer of metal and a layer of silicon and annealing the metal/silicon films to mix the two materials by melting and/or diffusion, forming a new conductive layer. According to some embodiments, a thickness of the conductive films ranges from 200 Ångstroms (Å) to about 600 Å. In embodiments where the conductive film is too thick, the capacitance of the capacitor decreases. When the conductive film is too thin, the deposited conductive layer is increasingly prone to having issues with complete coverage of the dielectric layer. Decreased coverage directly and proportionally decreases the capacitance of the capacitor.

Trench capacitor 500 includes a plurality of film pairs 507, 511, 515, and 519 layered atop each other. In some embodiments, a trench capacitor includes two film pairs. In some embodiments, a trench capacitor includes not more than 12 film pairs. In some embodiments, a liner layer is optionally deposited on the substrate within the opening. When present, a liner layer separates a substrate from a deposited layer of the capacitor when the deposited layer of the capacitor is the same type of material (e.g., an insulator or a conductor/semiconductor) as the substrate. In a non-limiting embodiment, a trench capacitor includes a liner layer comprising titanium nitride, although other liner layer materials are contemplated, such as tantalum, tantalum nitride, copper, and titanium. FIG. 5, as described below, includes a doped semiconductor material as substrate 502, a liner layer 504, and multiple film pairs 507, 511, 515, and 519 layered atop each other. In the embodiment of FIG. 5, the first layer of each film pair (e.g., layers 506, 510, 514, and 518) is a conductive layer, and the second layer of each film pair (e.g., layers 508, 512, 516, and 520) is an insulating layer. In other embodiments, the liner layer is omitted from the film stack when the substrate material and the first-deposited layer in the first film pair are opposite types of films (e.g., dielectric substrate, first-deposited layer is a conductive layer). In some embodiments, the film pairs include a first-deposited insulator layer and a second-deposited conductive layer. In some embodiments, liner layer 504 is a diffusion barrier material. In some embodiments, liner layer 504 is an insulating material that electrically isolates a semiconductor substrate from a first-deposited conductive layer in a film pair. In the embodiment of FIG. 5, liner layer 504 is an insulating liner layer, separating a conductive layer 506 from a doped semiconductor material in substrate 502. In some embodiments, the substrate in an insulator material, the liner layer is omitted, and the film pairs are deposited directly onto the substrate material, with a conductive layer being deposited first and an insulator layer being deposited second.

Conductive layers of film pairs are formed into capacitor plates of an integrated circuit capacitor when connected, via a contact plug or some other interconnect structure, to an electrode within an integrated circuit. In some embodiments, a number (N) of film pairs, or a number (N) of insulating layers and conductive layers, ranges from at least 2 to not more than 20, although larger numbers of film pairs are also envisioned within the scope of the present disclosure. In some embodiments, a thickness of insulating layers and conductive layers in a trench capacitor film stack is uniform throughout the film stack. In some embodiments, the thickness of insulating and conductive layers in a trench capacitor film stack is variable across a wafer, or within a stack of films in a capacitor, according to a capacitance specification of an integrated circuit. In some embodiments, each of the conductive layers has a thickness of about 200 Å to about 600 Å. In some embodiments, certain of the conductive layers have a different thickness from at least one of the conductive layers meeting or exceeding a predetermined minimum design thickness. In some embodiments, each of the conductive layers has a thickness of about 400 Å to about 450 Å. In some embodiments, prior to deposition of any insulating or conductive layer in a trench, a liner layer 504 is deposited in order to isolate the substrate material (doped, or undoped) from the trench capacitor film stack.

In some embodiments method 800 further includes an operation 825, a conductive layer trimming step, wherein a layer of conductive material is covered with a layer of photoresist or some other masking material and etched to leave behind a remaining portion of conductive material that covers the bottom and sides of trench 503A and a portion of the top side 502t of substrate 502 or, a top side 504t of liner material 504. Optionally, subsequent to trimming the conductive material, a sealing material 523 is deposited onto the top surface of the conductive material to protect an end portion of the conductive material (or the conductive layer 506, 510, 514, and/or 518). Subsequent to trimming of the conductive material, insulating material for insulating layers 508, 512, 516, and/or 520 is deposited onto the top surface of conductive material in a conductive layer (and a portion of the sealing material, if present), and the insulating material is also trimmed to form a film pair with a portion of the insulating material extending over an entirety of the top surface of a conductive layer on which the insulating material is deposited, and a portion of the sealing material at an end of each conductive layer. In some instances, a sealing material is an insulating material similar to the materials used for insulating layers, as described above in operation 825.

When multiple film pairs are deposited into a trench, the first film pair has a largest lateral spread on a top surface of the substrate 502 or liner 504, and each successive film pair has a smaller lateral spread. The reduction in lateral spread of the conductive layer and insulating layer in successive, or later-deposited, film pairs provides a lateral area or contact pad portion of the earlier-deposited conductive films, to which electrical contact is made using a via or conductive pillar formed through a later-deposited inter-layer dielectric material on top of the trench capacitor. The size and location of the lateral area of each conductive layer or film pair is determined during the trimming process. In some embodiments, the contact pad for one film pair or conductive layer is disposed at one end of the trench capacitor, and the contact pad for an adjoining film pair is disposed at a different end of the trench capacitor, to reduce a likelihood of accidental short misconnection of the vias extending through the ILD. In some embodiments, a single conducive layer has multiple contact pads, each contact pad being connected by a via/interconnect to a same charging line of the capacitor.

Method 800 may include optional operation 830, depositing, on at least a top-most insulating layer of the stack of insulating and conductive layers in film pairs, a filling insulator layer 522. Filling insulator layer 522 in FIG. 5 is deposited onto insulating layer 520 when a top surface of insulating layer 520 on one side of the trench is separated from a top side of insulating layer 520 on the other side of the trench. In some instances, a trench capacitor has two film pairs than are shown in FIG. 5. In some instances, a trench capacitor has not more than 12 film pairs.

Filling insulator layer 522 separated the top surface of insulating layer 520 on each side of the trench from the portion on the other side and provides structural stability for the film pairs deposited into the trench pattern. Filling insulator layer 522 includes one or more of SiNx, SiOx, SiON, SiC, SiCN, BN, SiBN, SiCBN or other dielectric materials suitable for filling an opening between portions of the top-most film pair on each side of the trench from the segment on the other side of the trench.

Method 800 includes an operation 840 in which top portion conductive layers, such as at the contact pads, as described above, are exposed for making electrical connections to portions of the integrated circuit. In some embodiments, prior to forming contact openings and exposing part of the contact pads, insulating and etch stop layers are deposited on top of film pairs and the filling insulating material 522.

Thus, in some embodiments, trench capacitor 500 includes a contact etch stop layer (CESL) 524 deposited over the substrate, the liner layer (if present), and the film pairs, and a second etch stop layer 526 to protect the CESL when forming contact plugs. Trench capacitor 500 also includes an inter-layer dielectric (ILD) 528 to isolate the capacitor from a remainder of the integrated circuit interconnects. As illustrated in FIG. 5, CESL 524 covers the filling insulating layer 522, and the insulating layers on top of each film pair and/or the contact pads of each film pair. CESL 524 comprises one or more layers of suitable etch stop materials including, but not limited to, SiNx, SiOx, SiON, SiC, SiCN, BN, SiBN, SiCBN, or combinations thereof. In some embodiments, the CESL 524 is formed by chemical vapor deposition (CVD), plasma-enhanced chemical vapor deposition (PE-CVD), physical vapor deposition (PVD), atomic layer deposition (ALD), spin-on coating, other suitable formation process(es), or combinations thereof. In some embodiments, a barrier or second etch stop layer 526 is deposited on top of CESL 524 in order to promote uniform etching of an inter-layer dielectric (ILD) 528 on top of the second etch stop layer. A second etch stop layer is used in some embodiments when the different chemical composition of the second etch stop layer improves selectivity of an etch process to the etch stop material during an etching process to reduce a risk of accidentally etching through a conductive layer during manufacturing processes. Etch stop layers are also selected to provide spectroscopic endpoints and/or sufficient etch time to clear the contact plug bottom of residual polymer or ILD material and reduce likelihood of blocked etches or small contact openings to conductive layers in a trench capacitor. Suitable materials for a second etch stop layer may include, SiNx, SiOx, SiON, SiC, SiCN, BN, SiBN, SiCBN, or combinations thereof, or other materials known in the art.

In some embodiments, electrical connection to another portion of the integrated circuit is performed using a contact (metal filled into a contact plug opening), or a via, through an inter-layer dielectric (ILD) 528 on top of second etch stop layer 526, a second mask layer 532 on top of ILD 528, and electrodes 534 and 536 that extend through second mask layer 532 and rest on ILD 528. In some embodiments, electrodes 534 and 536 rest on top of second mask layer 532 and are separated from ILD 528. Electrode 534 is electrically connected to conductive layer 510 by contact 530A, and to conductive layer 518 by contact 530C. Electrode 536 is electrically connected to conductive layer 514 by contact 530B, and to conductive layer 506 by contact 530D. Electrodes 534 and 536 are within ILD 538 on top of second mask layer 532. An etch process to form openings into which contacts 530A-D are formed etches through ILD 528, second etch stop layer 526, contact etch stop layer 524, and an insulating layer.

In some embodiments, a CESL is formed by chemical vapor deposition (CVD), plasma-enhanced chemical vapor deposition (PE-CVD), physical vapor deposition (PVD), atomic layer deposition (ALD), spin-on coating, other suitable formation process(es), or combinations thereof. In some embodiments, operation 840 includes depositing a second etch stop layer such as second etch stop layer 526, as described above. A second etch stop layer is formed by chemical vapor deposition (CVD), plasma-enhanced chemical vapor deposition (PE-CVD), physical vapor deposition (PVD), atomic layer deposition (ALD), spin-on coating, other suitable formation process(es), or combinations thereof, using materials as described above. Operation 840 includes deposition of an ILD 528 to separate electrodes 534 and 536 from the top surface of the conductive layers of the trench capacitor. ILD 528 is formed by chemical vapor deposition (CVD), plasma-enhanced chemical vapor deposition (PE-CVD), physical vapor deposition (PVD), atomic layer deposition (ALD), spin-on coating, other suitable formation process(es), or combinations thereof, and may include, but not be limited to, $SiN_x$, $SiO_x$, SiON, SiC, SiCN, BN, SiBN, SiCBN, borophosphosilicate glass (BPSG), tetraethyl orthosilicate (TEOS), spin on glass (SOG), undoped silicate glass (USG), fluorinated silicate glass (FSG), high-density plasma (HDP) oxide, plasma-enhanced TEOS (PE-TEOS) or combinations thereof. Operation 840 may include depositing a second mask layer 532 on top of ILD 528. In some embodiments, the second mask layer 532 is deposited by chemical vapor deposition (CVD), plasma-enhanced chemical vapor deposition (PE-CVD), physical vapor deposition (PVD), atomic layer deposition (ALD), spin on coatings, or other methods know in the art. Second mask layer 532 may include insulating films such as silicon oxide, silicon nitride (e.g., $Si_3N_4$), SiON, SiC, SiOC, or combinations thereof. Operation 840 includes processing steps directed toward forming a pattern, using a mask layer such as photoresist, on a top surface of ILD 528 or second mask layer 532, for contact plug openings in the ILD, and etching at least the ILD 528, second etch stop layer 526 (if present), and CESL 524 to expose top portions of conductive films (see conductive films 508, 512, 516, and 520 of FIG. 5) through the contact plug openings (not shown, but corresponding to the positions of contact plugs 532A-D of FIG. 5).

The method 800 includes operation 850, wherein an interconnect structure is connected to the conductive plates of the trench capacitor. An interconnect structure includes at least contact plugs (see contact plugs 530A-D and electrodes 534 and 536 of FIG. 5). In some instances, contact plugs are formed in contact plug openings (not shown) by filling the contact plug opening formed in operation 840 with a conductive contact material. Conductive contact material is a single layer of material, or a plurality of layers of conductive materials conducive to the filling of contact plug openings with conductive materials. In some embodiments, conductive contact material includes a liner material to prevent diffusion of metal from within the contact plug into the ILD where the contact plug is situated. In some embodiments, conductive contact material includes a metal, a metal nitride, a silicide, or some other conductive material. Examples of conductive contact materials include copper, aluminum, tungsten, titanium, ruthenium, cobalt, and alloys thereof, and another suitable conductive material known in the art. In some instances, conductive contact materials are deposited into contact plug openings by plating, PVD, sputtering, or any other suitable formation process. Conductive contact materials may include seed layers and barrier layers that are conducive to forming void-free contacts. Conductive contact materials may include materials that are processed (annealed, or implanted, or sputtered) to reduce contact resistance in the interconnect structure.

Some embodiments of operation 850 include processing steps related to removing from a top layer of ILD 528 or from second mask layer 532, a remainder of conductive contact material outside of the contact plugs in ILD 528. Removal of a remainder of such conductive contact material can be performed by CMP polishing, wet etching, plasma etching, or a combination thereof, according to techniques known in the art. Operation 850 may include processing steps such as depositing a second ILD (such as ILD 538), depositing photoresist, patterning the photoresist, depositing a second mask material, and etching the second ILD to form openings for electrodes that connect to contact plugs in connection with conductive layer of a trench capacitor.

Figure 6:
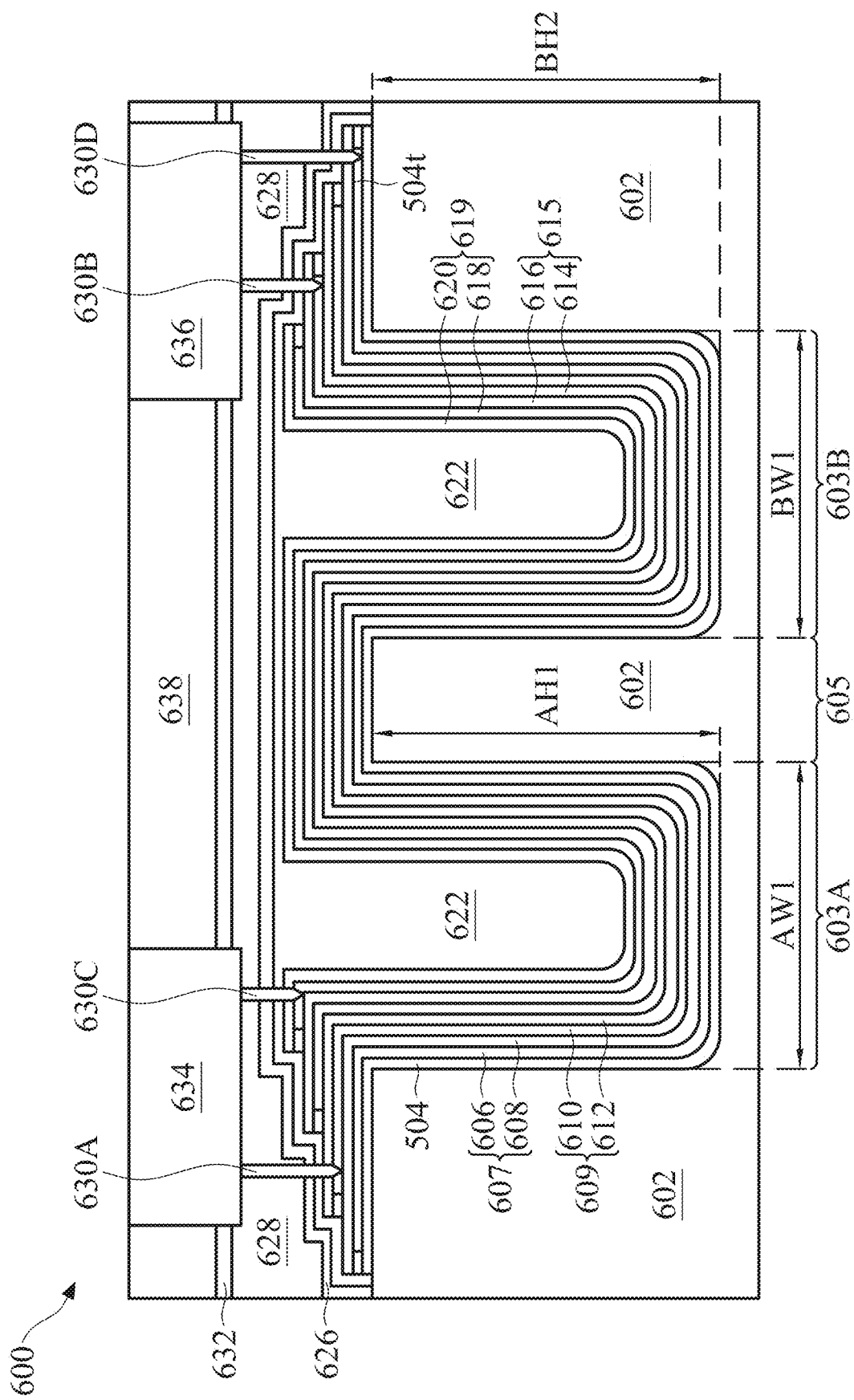
FIG. 6 is a cross-sectional view of a trench capacitor having a cross-hatched structure, according to some embodiments.

FIG. 6 is a cross-sectional view of a trench capacitor 600 having a cross-hatched structure (corresponding to a trench capacitor 300 along cross-sectional indicator B-B' of FIG. 3 or to the trench capacitor 400 along cross-sectional indicator D-D' of FIG. 4A). Numerals of FIG. 6 correspond to like numerals of FIG. 5, incremented by 100 for clarity to describe similar structural elements, materials used, and manufacturing methods for making similar trench capacitors. Trench capacitor 600 has a plurality of trenches, including trench 603A and 603B. Trench 603A has a depth AH1 and a width AW1, and trench 603B has a depth BH2 and a width BW2. A separation width 605 is a distance between nearest sidewalls of trenches 603A and 603B. A first electrode 634 is electrically connected to a first conductive layer 608 by a contact plug 630A, and to a third conductive layer 616 by a contact plug 630C. A second electrode 636 is electrically connected to a second conductive layer 612 by a contact plug 630B, and to a fourth conductive layer 620 by a fourth contact plug 630D. A trench capacitor with a cross-hatched structure such as capacitor 600 can physically (laterally) separate electrodes that contact different layers of the film pairs/conductive layers in the trenches. In some embodiments, one of the electrodes of a capacitor with cross-hatched structure are connected to the substrate by a grounding contact plug (not shown) in order to discharge residual carriers from a capacitor, or to ground one plate prior to charging the capacitor, preventing "floating" charge from disrupting the performance of the capacitor in an integrated circuit.

Figure 7:
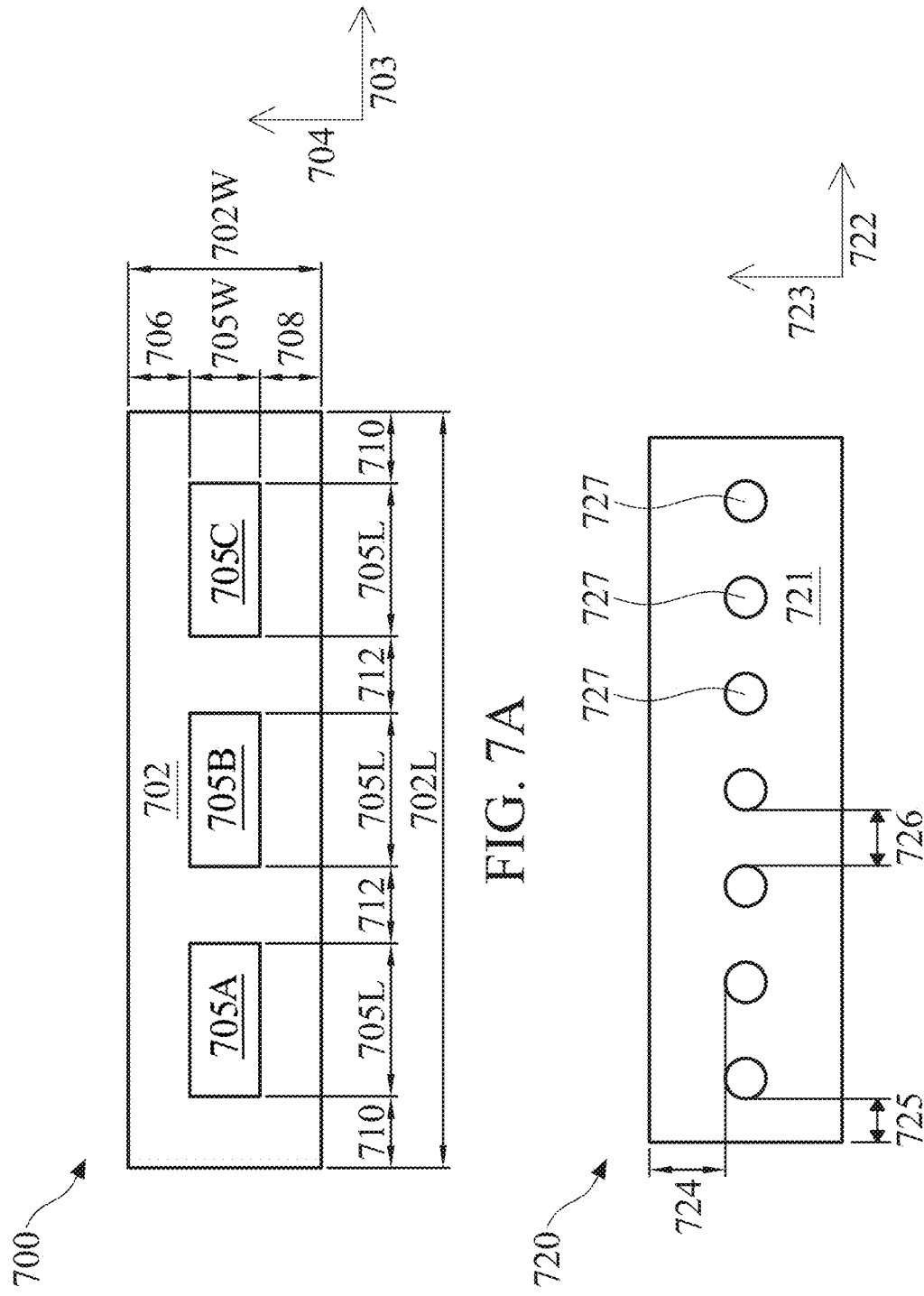
FIGS. 7A and 7B are plan views of capacitors having a field and island structure, according to some embodiments.

FIG. 7A is a plan view of a capacitor 700 having a recessed field 702. Recessed field 702 has a field length 702L in a first direction 703, and a field width 702W in a second direction 704. Field width 702W is smaller than field length 702L. Recessed field 702 is broken up by three islands 705A-C. Each island 705 has an island length 705L in the first direction and an island width 705W in the second direction. Each island is separated from an adjoining island by an inter-island separation distance 712, and from a sidewall of the recessed field 702 by separation distances 706, 708, and 710. In some embodiments, a ratio of the field width 702W and the island width 705W is about 3:1 (although ratios greater than 3:1 are also envisioned by the present disclosure), where the recessed field 702 includes trenches on opposite sides of the islands 705. In some embodiments, a ratio of the field width and island width is greater than 10:1, where the recessed field on each side of the islands is wider than it is deep, and the islands break up a broad recessed area with sidewall surface area on which conductive layers of a capacitor are deposited. In some embodiments, the separation distance 710 and the inter-island separation distance 712 are smaller than the island length 705L. In some embodiments, the separation distance and the inter-island separation distance are larger than the island length 705L. Islands 705 are included within recessed field 702 to provide additional surface area (on the sidewalls thereof, in addition to the sidewalls of the recessed field, and the flat area at the bottom of the recessed field) for capacitor plates. In some instances, a recessed field has a fixed field length and field width, and a surface area of a capacitor plate is modified by adding a plurality of islands with sidewalls for deposition of layers of conductive material for the capacitor plates.

FIG. 7B is a plan view of a capacitor 720 having a recessed field 721 filled with a plurality of islands 727, where the islands are rounded. In some embodiments, islands are elliptical. In some embodiments, islands are circular. In some embodiments, rounded islands 727 are separated from sidewalls of recessed field 721 by separation distances 725 (between an island and a short sidewall of recessed field 721) and 724 (between an island and a long sidewall of recessed field 721). In some embodiments, islands 727 are separated by an inter-island separation distance 726. In some embodiments, separation distance 726 is smaller than separation distances 724 and 725. Islands 727 within recessed field are present to provide additional sidewall area (in addition to the sidewalls of the recessed field, and the flat bottom areas of the recessed field) for capacitor plates (e.g., the conductive layers deposited over the substrate to store charge for the capacitor).

Figure 9:
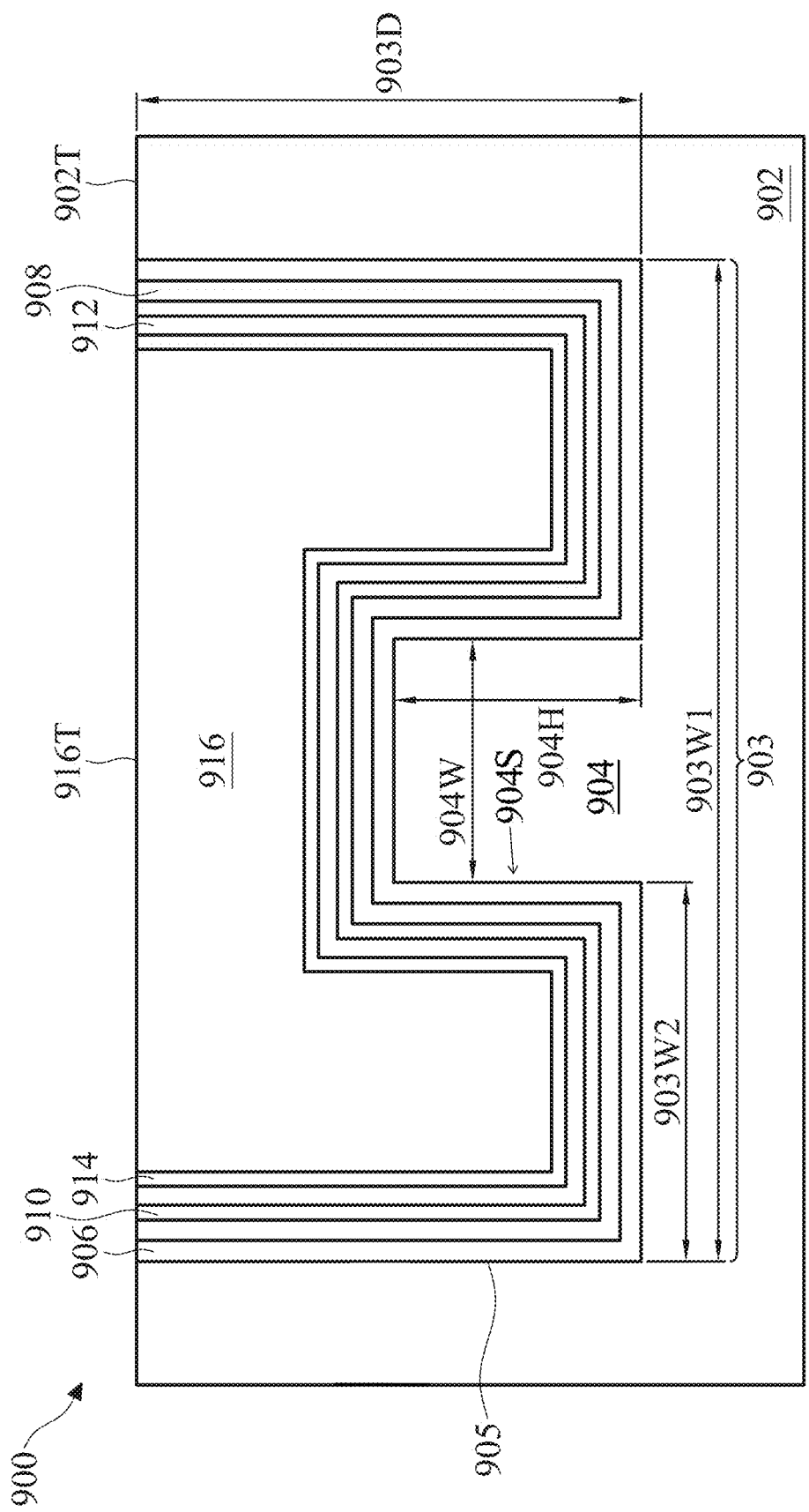
FIG. 9 is a cross-sectional diagram of a capacitor, according to some embodiments.

FIG. 9 is a cross sectional diagram of a capacitor 900 embedded in a substrate 903, having a recessed field 903 with a field depth 903D, a total field width 903W1 (extending between sidewalls of the recessed field 903), and a "half" field width 903W2 extending from one sidewall 905 to a sidewall 904S of an island 904 in the recessed field. Island 904 is a reduced-height island (also known as a reduced-height pillar). A reduced-height island has a height less than the height of a sidewall of the recessed field in which the reduced height island is located (e.g., island height 904H is less than field depth 903D). Island 904 has an island width 904W. A liner layer 906 is formed, according to techniques described above, on the substrate 902, and extends continuously over the sides and bottom of the recessed field 903, and over the sides and top of the island 904. In some embodiments, liner layer is omitted from the structure. Insulating layer 908 has been deposited, according to techniques described above, on the substrate (or, optionally the liner layer), and continuously covers the sides and bottom of the recessed field 903, and over the sides and top of the island 904. Conductive layer 910 has been deposited, according to techniques described above, onto insulating layer 908. Insulating film 912 has been deposited onto conductive layer 910, and conductive layer 914 has been deposited onto insulating film 912. Insulating layers 908 and 912, and conductive layers 910 and 914 extend continuously over the sidewalls and bottom of recessed field 903, and over the sidewalls 904S and top 904T of island 904. Insulating filler 916 has been deposited on top of conductive layer 914 within the recessed field 903, and the device has undergone planarization such that a top surface 902T of the substrate is substantially parallel with a top surface 916T of the insulating filler 916. Edge portions of conductive layers 910 and 914 are also substantially planar with top surfaces 916T and 902T. In some embodiments, island height 904H is equal to field depth 903D, such that planarization of the device results in a cross-sectional diagram resembling that shown in FIG. 6, where two trenches appear to be isolated (as along cross-sectional line B-B' or D-D') from each other by an intervening substrate pillar or island. According to some embodiments, a height 904H of island 904 is adjusted during manufacturing in order to adjust a capacitance of capacitor 900.

A structure for trench capacitors includes trenches extending in two directions, where space between primary trenches extending in a first direction is partially filled with secondary trenches extending in the second direction. By repurposing the space between primary trenches, formerly used to isolate adjoining capacitors, to storing charge, overall capacitance of a cross-hatched structure trench capacitor becomes greater (per unit of layout area of an integrated circuit) than for purely linear trench capacitors. Greater capacitance per unit layout area allows manufacturers to reduce die area, or to increase a number of capacitors in an integrated circuit, for similar manufacturing cost, increasing profitability. Cross-hatched structure trench capacitors are capable of fine adjustments to capacitance within a given layout area by modifying spacing between trenches, or by modifying island sizes within the capacitor layout area, at no additional cost (in terms of layout area), simplifying circuit design processes.

Some embodiments of methods for manufacturing a capacitor include the operations of etching a plurality of primary trenches into a first region of a substrate, with each of the primary trenches extending in a first direction, etching a plurality of secondary trenches into the first region of the substrate, with each of the secondary trenches extending in a second direction other than the first direction, with adjacent secondary trenches of the plurality of secondary trenches and adjacent primary trenches of the plurality of primary trenches jointly define an island, etching the island to recess an upper surface of the island relative to an upper surface of a second region of the substrate, with the second region of the substrate surrounding the first region of the substrate, depositing a first dielectric layer into each of the primary trenches, into each of the secondary trenches, and on the island, and depositing a first conductive layer on the first dielectric layer.

Some embodiments of methods for manufacturing a capacitor include one or more additional operations selected from a list including forming a first dielectric layer having a first dielectric top surface that is substantially parallel to a top surface of the substrate, forming a second dielectric layer having a second dielectric top surface that is substantially parallel to the top surface of the substrate, forming a first capacitor plate having a first capacitor plate top surface that is substantially parallel to the top surface of the substrate, forming a second capacitor plate having a second capacitor plate top surface that is substantially parallel to the top surface of the substrate, extending a portion of the first capacitor plate along a sidewall of the island, arranging each of the plurality of primary trenches to be perpendicular to each of the plurality of secondary trenches, forming a second conductive layer, wherein the first and second conductive layers collectively form the first capacitor plate, forming third and fourth conductive layers, with the third and fourth conductive layers collectively forming the second capacitor plate, arranging each of the secondary trenches having a distal end opening into a first primary trench of the plurality of primary trenches and a proximal end opening into a second primary trench of the plurality of primary trenches, wherein each of the plurality of secondary trenches has a length equal to a minimum distance between the first and secondary primary trenches of the plurality of primary trenches, arranging each of the secondary trenches having a distal end extending beyond a first primary trench of the plurality of primary trenches and a proximal end extending beyond a second primary trench of the plurality of primary trenches, wherein each of the plurality of secondary trenches has a length greater than a distance between the first and secondary primary trenches of the plurality of primary trenches, depositing a plurality of film pairs on the first conductive layer, each film pair of the plurality of film pairs including a single dielectric layer and a single conductive layer, establishing a first contact to the single conductive layer for a first set of the plurality of film pairs, establishing a second contact to the single conductive layer for a second set of the film pairs, wherein none of the single conductive layers is common to both the first set of the plurality of film pairs and the second set of the plurality of film pairs, and/or patterning a first interconnection structure in electrical contact with both the first contact and the second contact.

Some embodiments of methods for manufacturing a capacitor include the operations of applying, a capacitor pattern to a substrate, the capacitor pattern being a cross-hatched pattern, recessing the substrate to a first depth using the capacitor pattern as an etch mask, to form a recessed portion of the substrate, and depositing, within the recessed portion of the substrate, a plurality of film pairs, each film pair of the plurality of film pairs comprising an insulating layer and a conductive layer.

Some embodiments of methods for manufacturing a capacitor include one or more additional operations selected from a list including depositing an inter-layer dielectric material on the substrate and the plurality of film pairs within the recessed portion, exposing, with openings through the inter-layer dielectric material, a conductive layer of at least two film pairs of the plurality of film pairs, filling the openings through the inter-layer dielectric material with a conductive contact material, depositing an electrode material on a top surface of the inter-layer dielectric material and the conductive contact material, and/or separating a first portion of the electrode material from a second portion of the electrode material.

Some embodiments of methods for manufacturing a capacitor include the operations of applying a capacitor pattern to a substrate, the capacitor pattern including an island pattern, etching the substrate to a first depth using the capacitor pattern as an etch mask to form a plurality of trenches that define an island structure, recessing an upper surface of the island structure relative to an upper surface of the substrate, and depositing a plurality of film pairs on the trenches and the island structure, wherein each film pair of the plurality of film pairs consists of an insulating layer and a conductive layer.

Some embodiments of methods for manufacturing a capacitor include one or more additional operations selected from a list including arranging a first pair of trenches to cross a second pair of trenches to form the island structure having a rectangular shape, arranging a first subset of trenches to cross a second subset of trenches to form a plurality of island structures including the island structure, establishing a first electrical contact with a first subset of the plurality of film pairs, the first subset including a first film pair and each additional odd-numbered film pair of the plurality of film pairs, establishing a second electrical contact with a second subset of the plurality of film pairs, the second subset including a second film pair and each additional even-numbered film pair of the plurality of film pairs, recessing an upper surface of the island structure relative to an upper surface of the substrate by a distance at least equal to a cumulative thickness of the plurality of film pairs deposited on the trenches and the island structure, recessing an upper surface of the island structure relative to an upper surface of the substrate by a distance less than a cumulative thickness of the plurality of film pairs on the trenches and the island structure, depositing an inter-layer dielectric material on the substrate and the plurality of film pairs, etching the inter-layer dielectric material to form openings exposing a conductive layer of at least two film pairs of the plurality of film pairs, filling the openings through the inter-layer dielectric material with a conductive contact material, depositing an electrode material on a top surface of the inter-layer dielectric material and the conductive contact material, and/or separating a first portion of the electrode material from a second portion of the electrode material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor comprising:
   a substrate;
   a first primary trench in the substrate extending in a first direction;
   a plurality of secondary trenches in the substrate extending in a second direction and intersecting the first primary trench, wherein
      adjacent secondary trenches of the plurality of secondary trenches and the first primary trench jointly define a protruding region, and
   a first dielectric material separating the substrate from a first capacitor plate; and
   a second dielectric material separating the first capacitor plate from a second capacitor plate,
   wherein the first dielectric material, the first capacitor plate, the second dielectric material, and the second capacitor plate cover an upper surface of the protruding region, the first primary trench, and the plurality of secondary trenches; and
   a second primary trench in the substrate extending in the first direction, wherein the first and second primary trenches and two of the plurality of secondary trenches cooperate to define the protruding region having the upper surface.

2. The capacitor of claim 1, wherein
   an upper surface of the substrate is coplanar with an upper surface of each of the first dielectric material, the first capacitor plate, the second dielectric material, and the second capacitor plate.

3. The capacitor of claim 1, wherein
   a portion of first capacitor plate extends along a sidewall of the protruding region.

4. The capacitor of claim 1, wherein
   the first direction is perpendicular to the second direction.

5. The capacitor of claim 1, wherein
   the first capacitor plate comprises a plurality of conductive layers.

6. The capacitor of claim 5, wherein
   the second capacitor plate comprises a plurality of conductive layers.

7. The capacitor of claim 1, wherein
   adjacent secondary trenches of the plurality of secondary trenches are separated by a first trench pitch distance.

8. The capacitor of claim 1,
   wherein the protruding region has sidewalls that are covered by the first dielectric material, the first capacitor plate, the second dielectric material, and the second capacitor plate.

9. The capacitor of claim 8, wherein
the upper surface of the protruding region is completely covered by the first dielectric material, the first capacitor plate, the second dielectric material, and the second capacitor plate.

10. The capacitor of claim 9, wherein
the first dielectric material, the first capacitor plate, the second dielectric material, and the second capacitor plate extend to a periphery of the capacitor.

11. The semiconductor device of claim 1, wherein the adjacent secondary trenches and the second primary trench define a second protruding region comprising the substrate material, and each of the first primary trench and the second primary trench is between the protruding region and the second protruding region.

12. A capacitor comprising:
a substrate;
a plurality of primary trenches in the substrate extending in a first direction;
a plurality of secondary trenches in the substrate extending in a second direction and intersecting the primary trenches, wherein
    adjacent secondary trenches of the plurality of secondary trenches and an exterior primary trench jointly define a protruding region, and
    adjacent secondary trenches of the plurality of secondary trenches and adjacent primary trenches of the plurality of primary trenches define an island region
a first dielectric material separating the substrate from a first capacitor plate; and
a second dielectric material separating the first capacitor plate from a second capacitor plate,
    wherein the first dielectric material, the first capacitor plate, the second dielectric material, and the second capacitor plate cover upper surfaces of the protruding region and the island region, and
    the first dielectric material, the first capacitor plate, the second dielectric material, and the second capacitor plate cover lower surfaces and sidewall surfaces of each of the plurality of primary trenches and each of the plurality of secondary trenches.

13. The capacitor of claim 12, wherein
the first direction is perpendicular to the second direction.

14. The capacitor of claim 13, wherein
the plurality of secondary trenches comprises at least three secondary trenches.

15. The capacitor of claim 12 wherein
each of the plurality of primary trenches has a first depth; and
each of the plurality of secondary trenches has a second depth.

16. The capacitor of claim 15 wherein
the first depth and the second depth are equal.

17. A semiconductor device, comprising:
a substrate comprising a substrate material having an upper surface, wherein the upper surface defines a first plane;
a capacitor, wherein the capacitor comprises:
    a first primary trench in the substrate extending in a first direction;
    a plurality of secondary trenches in the substrate extending in a second direction and intersecting the first primary trench, wherein
    adjacent secondary trenches of the plurality of secondary trenches and the first primary trench jointly defining a protruding region comprising the substrate material and having an upper surface;
    a first dielectric material separating the substrate from a first capacitor plate; and
    a second dielectric material separating the first capacitor plate from a second capacitor plate;
a first electrode electrically connected to the first capacitor plate; and
a second electrode electrically connected to the second capacitor plate, wherein
the capacitor further includes a second primary trench extending in the first direction, and the adjacent secondary trenches and the second primary trench define a second protruding region comprising the substrate material, and each of the first primary trench and the second primary trench is between the protruding region and the second protruding region.

18. The semiconductor device of claim 17, wherein
the first electrode is separated, in a direction parallel to a top surface of the substrate, from a sidewall of the first primary trench, sidewalls of the secondary trenches, and an edge of the second capacitor plate.

19. The semiconductor device of claim 17, further comprising
a third capacitor plate; and
a conductor electrically connecting the first capacitor plate and the third capacitor plate.

20. The semiconductor device of claim 17,
wherein the first and second primary trenches and two of the plurality of secondary trenches cooperate to define an island region comprising the substrate material and having an upper surface.

* * * * *